United States Patent
Tanaka

(10) Patent No.: US 12,001,691 B2
(45) Date of Patent: Jun. 4, 2024

(54) MEMORY CONTROLLER AND MEMORY ACCESS CONTROL METHOD

(71) Applicant: Panasonic Intellectual Property Management Co., Ltd., Osaka (JP)

(72) Inventor: Kazuhito Tanaka, Shiga (JP)

(73) Assignee: Panasonic Automotive Systems Co., Ltd., Osaka (JP)

( * ) Notice: Subject to any disclaimer, the term of this patent is extended or adjusted under 35 U.S.C. 154(b) by 213 days.

(21) Appl. No.: 17/702,624

(22) Filed: Mar. 23, 2022

(65) Prior Publication Data
US 2022/0308771 A1 Sep. 29, 2022

(30) Foreign Application Priority Data

Mar. 24, 2021 (JP) ................................. 2021-050871

(51) Int. Cl.
*G06F 3/06* (2006.01)
*G11C 7/22* (2006.01)

(52) U.S. Cl.
CPC .......... *G06F 3/0622* (2013.01); *G06F 3/0634* (2013.01); *G06F 3/0659* (2013.01); *G06F 3/0679* (2013.01); *G11C 7/222* (2013.01)

(58) Field of Classification Search
CPC .... G06F 3/0622; G06F 3/0634; G06F 3/0659; G06F 3/0679; G11C 7/222; G11C 11/4076
See application file for complete search history.

(56) References Cited

U.S. PATENT DOCUMENTS

| | | | | |
|---|---|---|---|---|
| 6,615,326 B1* | 9/2003 | Lin | ..................... | G06F 13/1647 711/168 |
| 7,281,110 B1* | 10/2007 | Cismas | ............... | G06F 13/1626 711/158 |

(Continued)

FOREIGN PATENT DOCUMENTS

| | | |
|---|---|---|
| JP | 2004-13618 A | 1/2004 |
| JP | 2004-252960 A | 9/2004 |
| JP | 2008204258 A | 9/2008 |

OTHER PUBLICATIONS

Office Action, issued Apr. 25, 2023, for Japanese Patent Application No. 2021-050871. (9 pages) (with English Translation).

(Continued)

*Primary Examiner* — Kalpit Parikh
(74) *Attorney, Agent, or Firm* — Seed IP Law Group LLP

(57) ABSTRACT

A memory controller controls access to a Synchronous Dynamic Random Access Memory (SDRAM) including banks. The memory controller includes: a receiver that receives a memory access request from an access master; a selector that selects one of a first issue mode and a second issue mode each related to command issuing; and an issuer that issues a command sequence to the SDRAM in response to the memory access request, in accordance with the one of the first issue mode and the second issue mode which is selected by the selector. The first issue mode is a mode in which an activation command for activating a bank among the banks is issued in continuous clock cycles without dividing the activation command, the activation command being included in the command sequence. The second issue mode is a mode in which the activation command is divided and issued in non-continuous clock cycles.

16 Claims, 5 Drawing Sheets

(56) References Cited

U.S. PATENT DOCUMENTS

2003/0229750 A1  12/2003  Higuchi
2006/0059320 A1   3/2006  Akizuki
2017/0365309 A1  12/2017  Shin et al.

OTHER PUBLICATIONS

JEDEC Solid State Technology Association, "Low Power Double Data Rate 5 (LPDDR5)," JESD209-5A. 546 pages.

* cited by examiner

MEMORY CONTROLLER AND MEMORY ACCESS CONTROL METHOD

CROSS REFERENCE TO RELATED APPLICATION

The present application is based on and claims priority of Japanese Patent Application No. 2021-050871 filed on Mar. 24, 2021. The entire disclosure of the above-identified application, including the specification, drawings and claims is incorporated herein by reference in its entirety.

FIELD

The present disclosure relates to a memory controller for controlling access to an SDRAM and a memory access control method.

BACKGROUND

Patent Literature (PTL) 1 discloses a memory controller which improves processing time by preventing continuous access to the same bank of a synchronous dynamic random access memory (SDRAM).

PTL 2 discloses an access controller which can ensure efficient memory access by reducing the clock cycles required for access to an SDRAM when the same row within the same bank is accessed continuously.

CITATION LIST

Patent Literature

PTL 1: Japanese Unexamined Patent Application Publication No. 2004-252960
PTL 2: Japanese Unexamined Patent Application Publication No. 2004-013618

SUMMARY

The memory controller of PTL 1 and PTL2 described above can be improved upon.

Therefore, a memory controller and a memory access control method of the present disclosure are capable of improving upon the above related art.

In accordance with an aspect of the present disclosure, a memory controller that controls access to a Synchronous Dynamic Random Access Memory (SDRAM) including banks includes: a receiver that receives a memory access request from an access master; a selector that selects one of a first issue mode and a second issue mode each related to command issuing; and an issuer that issues a command sequence to the SDRAM in response to the memory access request, in accordance with the one of the first issue mode and the second issue mode which is selected by the selector, wherein the first issue mode is a mode in which an activation command for activating a bank among the banks is issued in continuous clock cycles without dividing the activation command, the activation command being included in the command sequence, and the second issue mode is a mode in which the activation command is divided and issued in non-continuous clock cycles.

In accordance with another aspect of the present disclosure, a memory access control method of controlling access to a Synchronous Dynamic Random Access Memory (SDRAM) including banks includes: receiving a memory access request from an access master; selecting one of a first issue mode and a second issue mode each related to command issuing; and issuing a command sequence to the SDRAM in response to the memory access request in accordance with the one of the first issue mode and the second issue mode which is selected in the selecting, wherein the first issue mode is a mode in which an activation command for activating a bank among the banks is issued in continuous clock cycles without dividing the activation command, the activation command being included in the command sequence, and the second issue mode is a mode in which the activation command is divided and issued in non-continuous clock cycles.

These general and specific aspects may be implemented to a system, a method, an integrated circuit, a computer program, or a computer-readable recording medium such as a Compact Disc-Read Only Memory (CD-ROM), or may be any combination of them.

According to the present disclosure, it is possible to achieve further improvement.

BRIEF DESCRIPTION OF DRAWINGS

These and other advantages and features will become apparent from the following description thereof taken in conjunction with the accompanying Drawings, by way of non-limiting examples of embodiments disclosed herein.

Figure 1:
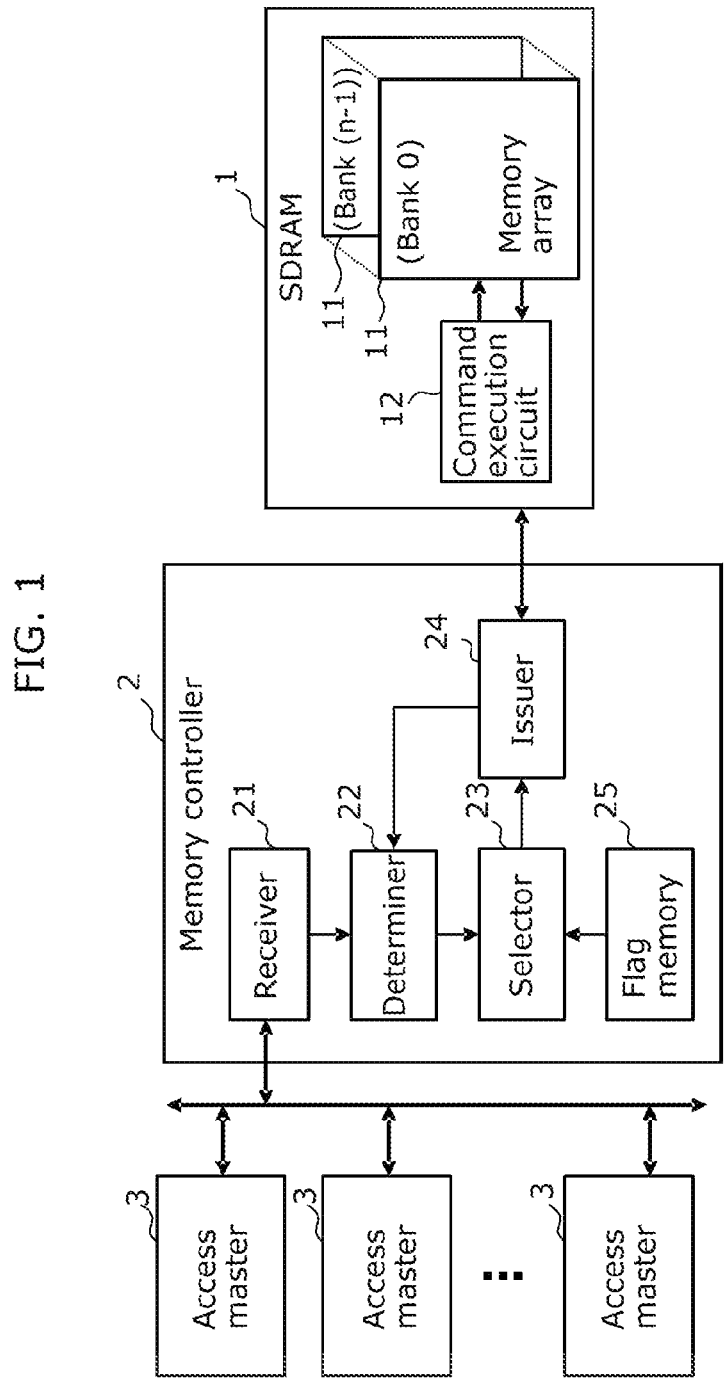
FIG. 1 is a block diagram illustrating a configuration example of a system including a memory controller, access masters, and an SDRAM in an embodiment.

DESCRIPTION OF EMBODIMENT (Circumstances Leading to Obtaining One Aspect of the Present Disclosure)

The present inventors discovered that the following problem occurs in relation to a semiconductor memory device that is an SDRAM which is described in the "Background" section.

In an SDRAM standard called low power double data rate 5 (LPDDR5), a new clock system has been introduced, and in accompaniment therewith, specifications pertaining to command issuing have also been changed.

Various commands are issued from a memory controller to an SDRAM in synchrony with both edges (rising edge and falling edge) of the clock. Among the various commands, an activation command is a command for activating a row on a designated bank within the SDRAM, and is two cycles in length. The activation command can be divided into two commands that are each one cycle in length. Partial commands obtained by dividing the activation command in two will be referred to as "ACT1 command" and "ACT2 command". The ACT1 command and the ACT2 command can be issued in two cycles that are non-continuous. There can be an interval of a maximum of eight cycles between the ACT1 command and the ACT2 command.

Further, a read command, a write command and the like are each one cycle in length. A burst length that is the standard minimum access unit of a read command and a write command in LPDDR5 is 16 beats. Note that, the clock signal of the data bus is four times the speed of the clock signal of the command bus. The aforementioned 16 beats are eight cycles of the clock signal of the data bus, and are two cycles of the clock signal of the command bus.

In order to execute a read or write with a burst length of 16 beats continuously multiple times, it suffices to issue a read command or a write command one time for every two cycles of the command bus (that is, at every other cycle).

However, the following problem can arise in a case where issuing of a command of a prior access request and issuing of a command of an access request subsequent to the prior access request compete. For example, during continuous access of a prior access request, when an activation command (two cycles in length) for accessing a new bank corresponding to a subsequent access request is issued, for a read command or a write command before and after the timing at which the activation command was issued, there will be two cycles which are empty, and therefore a bubble is generated in the data bus and continuous access can no longer be performed, and consequently the efficiency of the data bus is deteriorated.

Generation of the bubble in this case is for one cycle (four cycles of the data bus clock), and it may be only a slight amount in the case of a single access request. However, for example, in the case of issuing an activation command frequently to a new bank in processing involving a data access for a large amount of data such as encoding or decoding of a moving image, a deterioration in efficiency with respect to access to the SDRAM occurs due to the generated bubble.

Therefore, the present disclosure achieves optimization of SDRAM access performance by utilizing the fact that an activation command is divisible.

In order to solve the above problems, in accordance with an aspect of the present disclosure, a memory controller that controls access to a Synchronous Dynamic Random Access Memory (SDRAM) including banks includes: a receiver that receives a memory access request from an access master; a selector that selects one of a first issue mode and a second issue mode each related to command issuing; and an issuer that issues a command sequence to the SDRAM in response to the memory access request, in accordance with the one of the first issue mode and the second issue mode which is selected by the selector, wherein the first issue mode is a mode in which an activation command for activating a bank among the banks is issued in continuous clock cycles without dividing the activation command, the activation command being included in the command sequence, and the second issue mode is a mode in which the activation command is divided and issued in non-continuous clock cycles.

According to this, further improvement can be achieved. For example, it is possible to optimize the access efficiency by enabling a selection between a first issue mode which does not divide an activation command and a second issue mode which divides an activation command. For example, optimization is possible by enabling a selection between the first issue mode and the second issue mode according to a usage which processes memory data.

Here, the memory controller may further include: a determiner that (i) determines, when the receiver receives the memory access request, whether or not the issuer has a prior unissued command corresponding to a prior memory access request received prior to the memory access request, the prior unissued command not having been issued from the issuer, and (ii) determines, when the determiner determines that the issuer has the prior unissued command, whether or not a bank corresponding to the memory access request among the banks is different from a bank corresponding to the prior unissued command among the banks, the prior unissued command being a read command or a write command, wherein when the determiner determines that the bank corresponding to the memory access request is different from the bank corresponding to the prior unissued command, the selector performs the selecting.

According to this, optimization can be achieved by selecting between the respective merits and demerits of the first issue mode and the second issue mode.

In the first issue mode, although a bubble is generated in continuous access of a prior access request and the bus efficiency deteriorates, the latency for read data or write data with respect to a different bank of a subsequent access request (target access request subsequent to the prior access request) can be made with the minimum latency.

On the other hand, in the second issue mode, although continuous access of a prior access request can be guaranteed and the bus efficiency is not deteriorated, a delay of one cycle occurs with respect to the minimum latency for read data or write data of a subsequent access request.

In other words, in the first issue mode, minimization of the latency of a subsequent access request is given priority. In the second issue mode, continuous access of a prior access request is guaranteed to thereby give priority to the efficiency of the data bus.

Here, it is possible that when the determiner determines that the issuer does not have the prior unissued command, the selector selects the first issue mode.

According to this, in a case where a command of a prior access request and a command of a subsequent access request do not compete, the first issue mode is selected for the subsequent access request, and hence continuous access of the prior access request is guaranteed and, furthermore, the latency of the subsequent access request can be minimized.

Here, it is possible that the selector selects the first issue mode when the access master from which the receiver has received the memory access request is a first access master among a plurality of access masters, and the selector selects the second issue mode when the access master is a second access master among the plurality of access masters.

According to this, since access masters and issue modes are associated with each other, an optimal issue mode can be selected individually for each access master.

Here, it is possible that the receiver receives a mode designation command designating one of the first issue mode and the second issue mode, and the selector performs the selecting in accordance with the mode designation command.

According to this, an optimal issue mode can be selected by means of a mode designation command.

Here, the memory controller may further include: a memory holding flag information designating one of the first issue mode and the second issue mode, wherein the selector reads the flag information from the memory, and performs the selecting in accordance with the flag information read.

According to this, an optimal issue mode can be rapidly selected by means of flag information.

Here, it is possible that the receiver receives a mode designation command designating one of the first issue mode and the second issue mode, generates the flag information in accordance with the mode designation command, and stores the flag information into the memory.

According to this, flag information can be set by means of a mode designation command, and a more optimal issue mode can be selected.

Here, it is possible that the receiver receives the mode designation command from the access master or another device.

According to this, since there are a plurality of devices which are capable of issuing a mode designation command, the flexibility of the system can be enhanced.

Here, it is possible that the flag information is stored in the memory for each of a plurality of access masters including the access master, and the selector reads the flag information corresponding to the access master from which the receiver has received the memory access request, and performs the selecting in accordance with the flag information read.

According to this, since flag information and access masters are associated with each other, an optimal issue mode can be selected individually for each access master.

In accordance with another aspect of the present disclosure, a memory access control method of controlling access to a Synchronous Dynamic Random Access Memory (SDRAM) including banks includes: receiving a memory access request from an access master; selecting one of a first issue mode and a second issue mode each related to command issuing; and issuing a command sequence to the SDRAM in response to the memory access request in accordance with the one of the first issue mode and the second issue mode which is selected in the selecting, wherein the first issue mode is a mode in which an activation command for activating a bank among the banks is issued in continuous clock cycles without dividing the activation command, the activation command being included in the command sequence, and the second issue mode is a mode in which the activation command is divided and issued in non-continuous clock cycles.

According to this, for example, optimization is possible by enabling a selection between the first issue mode and the second issue mode according to a usage which processes memory data.

Here, the memory access control may further include: determining, when the memory access request is received in the receiving, whether or not a prior unissued command corresponding to a prior memory access request received prior to the memory access request is present, the prior unissued command not having been issued; and determining, when the prior unissued command is determined to be present, whether or not a bank corresponding to the memory access request among the banks is different from a bank corresponding to the prior unissued command among the banks, wherein the selecting is performed when the bank corresponding to the memory access request is determined to be different from the bank corresponding to the prior unissued command.

According to this, optimization can be achieved by selecting between the respective merits and demerits of the first issue mode and the second issue mode.

In the first issue mode, although a bubble is generated in continuous access of a prior access request and the bus efficiency deteriorates, the latency for read data or write data with respect to a different bank of a subsequent access request can be made the minimum latency.

On the other hand, in the second issue mode, although continuous access of a prior access request can be guaranteed and the bus efficiency is not deteriorated, a delay of one cycle occurs with respect to the minimum latency for read data or write data of a subsequent access request.

In other words, in the first issue mode, minimization of the latency of a subsequent access request is given priority. In the second issue mode, continuous access of a prior access request is guaranteed to thereby give priority to the efficiency of the data bus.

Here, it is possible that in the selecting, the first issue mode is selected when the prior unissued command is not determined to be present.

According to this, in a case where a command of a prior access request and a command of a subsequent access request do not compete, the first issue mode is selected for the subsequent access request, and hence continuous access of the prior access request is guaranteed and, furthermore, the latency of the subsequent access request can be minimized.

Here, it is possible that in the selecting, the first issue mode is selected when the access master from which the memory access request has been received in the receiving is a first access master among a plurality of access masters, and the second issue mode is selected when the access master is a second access master among the plurality of access masters.

According to this, since access masters and issue modes are associated with each other, an optimal issue mode can be selected individually for each access master.

Here, the memory access control method may further include: receiving a mode designation command designating one of the first issue mode and the second issue mode, wherein the selecting is performed in accordance with the mode designation command.

According to this, an optimal issue mode can be selected by means of a mode designation command.

Here, it is possible that the selecting includes: reading, from a memory, flag information designating one of the first issue mode and the second issue mode; and selecting one of the first issue mode and the second issue mode in accordance with the read flag information.

According to this, an optimal issue mode can be selected by means of flag information.

Here, the memory access control method may further include: receiving a mode designation command designating one of the first issue mode and the second issue mode; generating the flag information in accordance with the mode designation command; and storing the flag information into the memory.

According to this, flag information can be set by means of a mode designation command, and a more optimal issue mode can be selected.

Here, the memory access control method may further include: receiving the mode designation command from the access master or another device.

According to this, since there are a plurality of devices which are capable of issuing a mode designation command, the flexibility of the system can be enhanced.

Here, it is possible that the flag information is stored in the memory for each of a plurality of access masters including the access master, and the selecting includes: reading the flag information corresponding to the access master from which the memory access request has been received; and selecting one of the first issue mode and the second issue mode in accordance with the read flag information.

According to this, since flag information and access masters are associated with each other, an optimal issue mode can be selected individually for each access master.

These general and specific aspects may be implemented to a system, a method, an integrated circuit, a computer program, or a computer-readable recording medium such as a Compact Disc-Read Only Memory (CD-ROM), or may be any combination of them.

Hereinafter, exemplary embodiments will be described in detail with reference to the accompanying Drawings.

The following embodiments are general or specific examples of the present disclosure. The numerical values, shapes, materials, elements, arrangement and connection configuration of the elements, steps, the order of the steps, etc., described in the following embodiments are merely examples, and are not intended to limit the present disclosure.

EMBODIMENT

[1.1 Configuration Example]

FIG. 1 is a block diagram illustrating a configuration example of a system including a memory controller, access masters, and an SDRAM in an embodiment.

The system illustrated in the figure includes SDRAM 1, memory controller 2, and a plurality of access masters 3.

SDRAM 1 includes a plurality of memory arrays 11, and command execution circuit 12.

The plurality of memory arrays 11 constitute n banks numbered from bank 0 to bank (n−1). Each of the plurality of memory arrays 11 includes memory cells arranged in a matrix shape, and a sense amplifier.

Command execution circuit 12 receives and executes various commands issued from memory controller 2.

It is assumed that SDRAM 1 is an SDRAM that conforms to LPDDR5. In particular, an activation command which SDRAM 1 is capable of executing is two cycles in length, and is divisible into two commands that are each one cycle in length. An activation command whose length of two cycles is not divided is described as "ACT command". The commands that result from dividing an activated command are described as "ACT1 command" and "ACT2 command". An activation command includes a bank address and a row address, and is a command for activating a row within a bank. Upon receiving an ACT command, command execution circuit 12 selects a bank designated by the bank address, and transfers data of a memory cell belonging to a row designated by the row address within the relevant bank to the sense amplifier.

Further, the clock signal of the data bus is four times the speed of the clock signal of the command bus. A continuous burst length that is the minimum access unit is 16 beats (eight cycles of the clock signal for data, and two cycles of the clock signal for a command). The clock signal for data is a differential signal, and the clock signal for a command is also a differential signal.

Further, a read command is one cycle in length, and a write command is also one cycle in length.

Memory controller 2 includes receiver 21, determiner 22, selector 23, issuer 24, and flag memory 25.

Receiver 21 receives a memory access request from each of the plurality of access masters 3.

Determiner 22 determines whether a timing at which a command corresponding to a memory access request which receiver 21 received is to be issued and a timing at which a command corresponding to a prior memory access request is to be issued are competing. Specifically, when receiver 21 receives a memory access request, determiner 22 determines whether issuer 24 has a prior unissued read command or write command corresponding to a prior memory access request. In addition, when determiner 22 determines that a prior unissued read command or write command is present, determiner 22 determines whether or not a bank corresponding to the received memory access request is different from a bank corresponding to the prior unissued read command or write command.

Selector 23 selects one of a first issue mode and a second issue mode that are each related to command issuing, in accordance with the result determined by determiner 22. Here, the first issue mode is a mode in which an activation command for activating a bank is issued in two continuous clock cycles without dividing the activation command. The second issue mode is a mode in which an activation command for activating a bank is divided and issued in two non-continuous clock cycles. Note that, selector 23 may read flag information from flag memory 25, and select one of the first issue mode and the second issue mode in accordance with the flag information read. The flag information is information which designates one of the first issue mode and the second issue mode. Note that, although an example in which an activation command is divided in two is discussed here as an example of dividing a command, the number of parts into which a command is divided may be three or more, and a command other than an activation command may also be divided.

In order to implement a memory access request which receiver 21 received, issuer 24 generates a command sequence which SDRAM 1 is capable of interpreting and executing, and issues each command included in the command sequence to SDRAM 1 sequentially at a timing that has been defined as a specification for SDRAM 1. At such time, issuer 24 issues the command sequence in accordance with the issue mode selected by selector 23. That is, when selector 23 selects the first issue mode, issuer 24 issues the command in two continuous clock cycles without dividing the activation command. On the other hand, when selector 23 selects the second issue mode, issuer 24 divides the activation command and issues the command in two or more non-continuous clock cycles.

Flag memory 25 holds flag information designating one of the first issue mode and the second issue mode. Note that, flag memory 25 may be a nonvolatile memory which stores flag information written at the time of factory shipment. Further, flag memory 25 may be a register which holds flag information written by initialization processing at power-on of the system and at a time of reset. Flag information in the register may be rewritable from an external device.

The plurality of access masters 3 are each, specifically, a video decoder, a video encoder, an audio decoder, an audio encoder, a CPU, a cache memory, a direct memory access controller (DMAC), a graphics controller, a digital signal processor (DSP) and the like. Each access master 3 transmits a memory access request to memory controller 2.

[2.1 Overall Operation Example]

Operations of memory controller 2 configured as described above will now be described.

Figure 2:
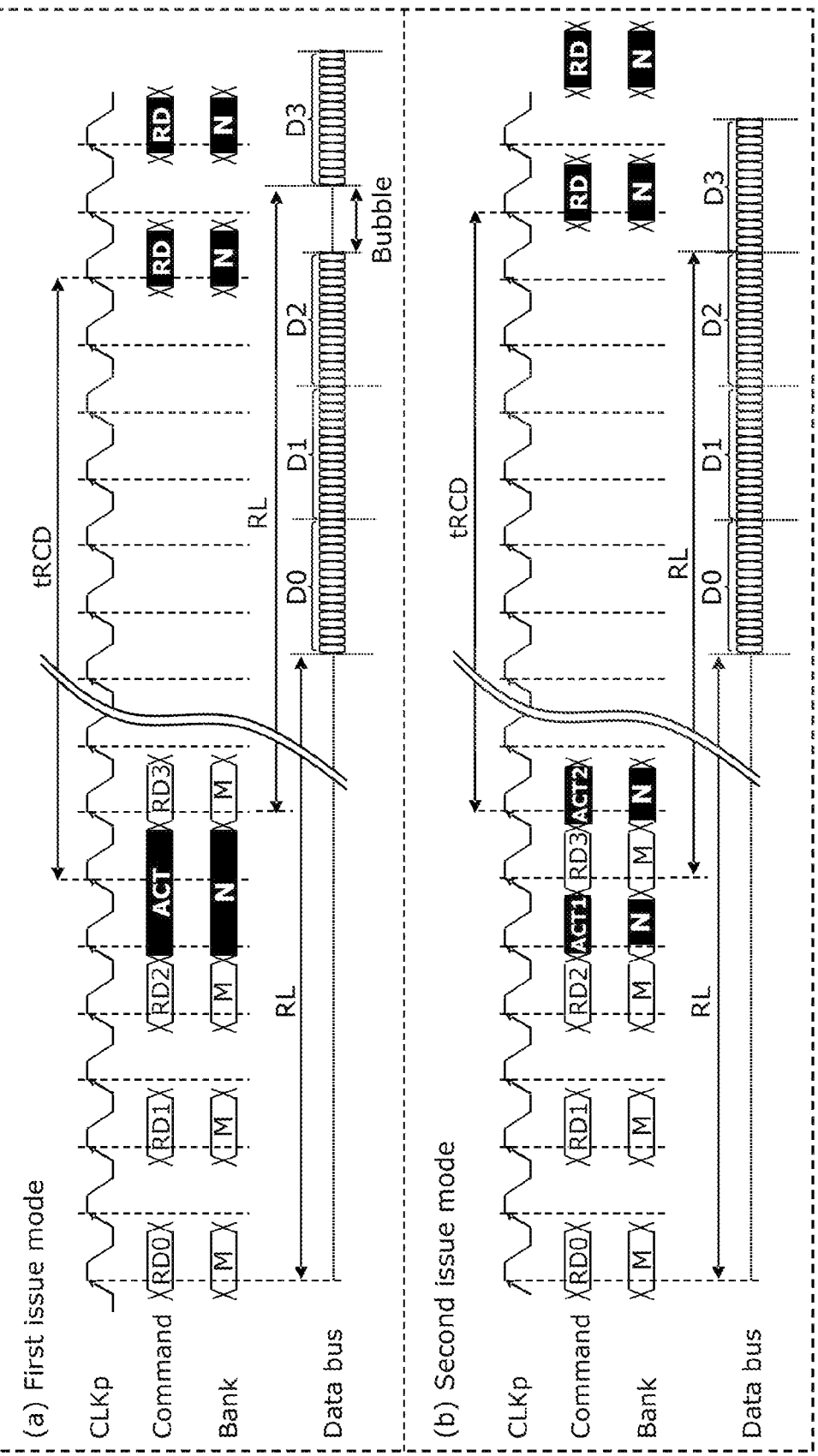
FIG. 2 is a time chart illustrating an example of operations of the memory controller in the embodiment.

FIG. 2 is a time chart illustrating an example of operations of memory controller 2 in the embodiment. Clock signal CLKp in the figure represents a signal on the plus side that is included in a differential clock signal of the command bus. Illustration of clock signal CLKn on the minus side is omitted.

A command field shows a command name. A bank field shows a bank name designated by a bank address in a command. A data bus field shows read data corresponding to a read command.

Commands and banks shown in black characters with a white background in the figure indicate commands and banks corresponding to a prior memory access request. Each command shown in white characters with a black background indicates a command corresponding to a subsequent memory access request.

Read commands RD0 to RD3 correspond to a prior memory access request, and are read commands to bank M. RL (read latency) shows the number of delay cycles from a cycle of a read command until a cycle in which read data is output.

Read data D0 to D3 are read data which were read out from bank M in accordance with read commands RD0 to RD3. Read data D0 to D3 each represent data of 16 beats of a continuous burst length that is a minimum access unit.

Reference character (a) in the upper section in the figure denotes a command sequence in accordance with the first issue mode. Further, reference character (b) in the figure denotes a command sequence in accordance with the second issue mode.

Activation command ACT corresponds to a subsequent memory access request and is a command of two cycles in length which is not divided, and indicates activation of bank N. This activation command ACT competes with prior unissued read command RD3 of the prior memory access request.

In the first issue mode of (a) in the figure, activation command ACT is issued with priority over read command RD3 of the prior access request. Read command RD3 is issued next after activation command ACT.

Thus, in the first issue mode, a bubble is generated in continuous access of a prior access request, and the bus efficiency with respect to the prior access request deteriorates. On the other hand, the latency for read data or write data with respect to a different bank of a subsequent access request can be made the minimum latency.

In the second issue mode of (b) in the figure, the activation command is divided into ACT1 and ACT2. Read command RD3 of the prior access request is issued in a cycle that is the second cycle after the cycle in which read command RD2 is issued, and is issued between activation commands ACT1 and ACT2. The issue interval occurring every other cycle is maintained also for read command RD3. As a result, read data D2 and D3 can be made continuous without causing a discontinuity in the minimum access unit.

Thus, in the second issue mode, continuous access of a prior access request can be maintained, and the bus efficiency with respect to the prior access request is not deteriorated. On the other hand, a delay of one cycle occurs with respect to the minimum latency for read data or write data of a subsequent access request. This is because ACT2 is shifted one cycle later in time compared to the first issue mode.

As illustrated in FIG. 2, in the first issue mode, minimization of the latency of a subsequent access request is given priority. In the second issue mode, continuous access of a prior access request is guaranteed to thereby give priority to the efficiency of the data bus. In this way, memory controller 2 can optimize by selecting between the respective merits and demerits of the first issue mode and the second issue mode.

Figure 3:
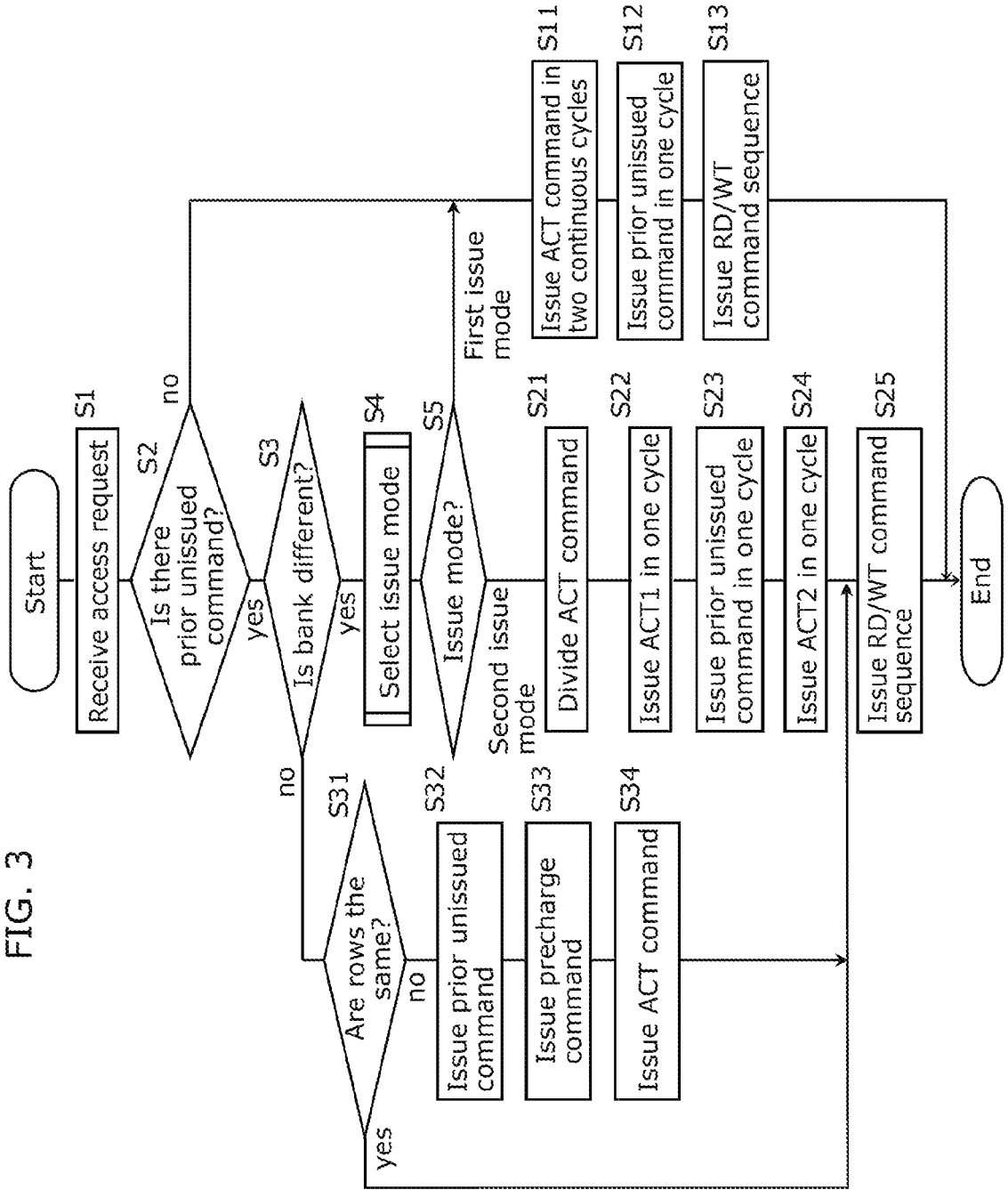
FIG. 3 is a flowchart illustrating an example of operations of the memory controller in the embodiment.

FIG. 3 is a flowchart illustrating an example of operations of memory controller 2 in the embodiment. In FIG. 3, receiver 21 receives a memory access request from any access master 3 (S1). Determiner 22 determines whether or not a prior unissued command that corresponds to a prior memory access request and has not yet been issued is present at the time when the memory access request is received by receiver 21 (S2), and if determiner 22 determines that such a prior unissued command is present, determiner 22 determines whether or not a bank corresponding to the received memory access request is different from a bank corresponding to the prior unissued command that is a read command (prior unissued read command) or a write command (prior unissued write command) (S3). Note that, the "prior unissued command" described here may be a prior unissued read command or a prior unissued write command.

If determiner 22 determines that the bank is different ("yes" in S3), selector 23 selects one of the first issue mode and the second issue mode based on flag information in flag memory 25 or the like (S4).

Next, in a case where selector 23 selects the first issue mode, issuer 24 issues activation command ACT in two continuous clock cycles without dividing activation command ACT (S11), and issues a prior unissued command of the prior memory access request in the next one cycle (S12). In addition, issuer 24 sequentially issues remaining read commands or write commands included in the command sequence of the subsequent memory access request (S13).

On the other hand, in a case where selector 23 selects the second issue mode, issuer 24 divides the activation command into ACT1 and ACT2 (S21), and issues activation commands ACT1 and ACT2 in two or more non-continuous clock cycles. That is, issuer 24 first issues activation command ACT1 in one cycle (S22), and issues a prior unissued command of the prior memory access request in the next one cycle (S23). Further, issuer 24 issues activation command ACT2 in one cycle (S24). Thereafter, issuer 24 sequentially issues remaining read commands or write commands included in the command sequence of the subsequent memory access request (S25).

Thus, according to the flowchart in FIG. 3, memory controller 2 can operate similarly to the time chart in FIG. 2. In the first issue mode, minimization of the latency of a subsequent access request is given priority. In the second issue mode, continuous access of a prior access request is guaranteed to thereby give priority to the efficiency of the data bus. In this way, memory controller 2 can optimize by selecting between the respective merits and demerits of the first issue mode and the second issue mode.

Further, in a case where determiner 22 determines that a prior unissued command is not present ("no" in S2), selector 23 selects the first issue mode as the default.

According to this, in a case where a command of a prior access request and a command of a subsequent access request do not compete, the first issue mode is selected for the subsequent access request, and hence continuous access of the prior access request is guaranteed and, furthermore, the latency of the subsequent access request can be minimized.

Further, if it is determined by determiner 22 that the bank is not different ("no" in S3), determiner 22 determines whether the row corresponding to the received memory access request and the row corresponding to the prior unissued read command or write command are the same (S31). If determiner 22 determines that the rows are the same ("yes" in S31), the processing proceeds to step S25. In this case it suffices to issue the prior unissued command of the subsequent memory access request before, after, or in an interval during, issuing of the command sequence of the subsequent memory access request in step S25. On the other hand, if determiner 22 determines that the row in question is different ("no" in S31), determiner 22 issues the prior unissued command of the prior memory access request (S32), and issues a precharge command (S33) to temporarily close the relevant bank, and thereafter issues an ACT command to the different row within the relevant bank (S34), and then proceeds to step S25.

[2.2 Selection Operation Example]

Next, an example of the operation in step S4 in FIG. 3 will be described.

Figure 4:
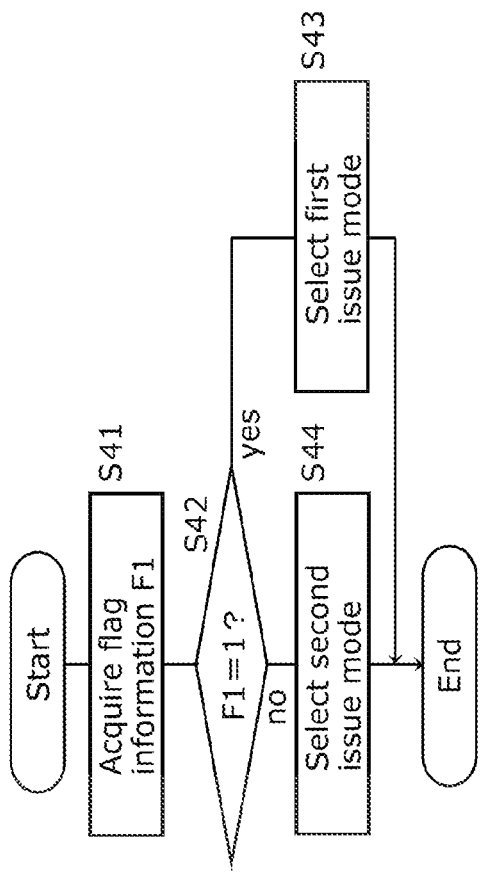
FIG. 4 is a flowchart illustrating an example of operations of a selector in the embodiment.

FIG. 4 is a flowchart illustrating an example of operations of the selector in the embodiment. In a case where determiner 22 determined that the bank is different, selector 23 reads flag information of flag memory 25 (S41), and determines whether or not flag F1 included in the flag information is "1" (S42). If flag F1 is "1", selector 23 selects the first issue mode (S43), while if flag F1 is not "1", selector 23 selects the second issue mode (S44).

According to this, selector 23 can rapidly select the optimal issue mode by means of flag information.

Next, another example of the operation in step S4 in FIG. 3 will be described.

Figure 5:
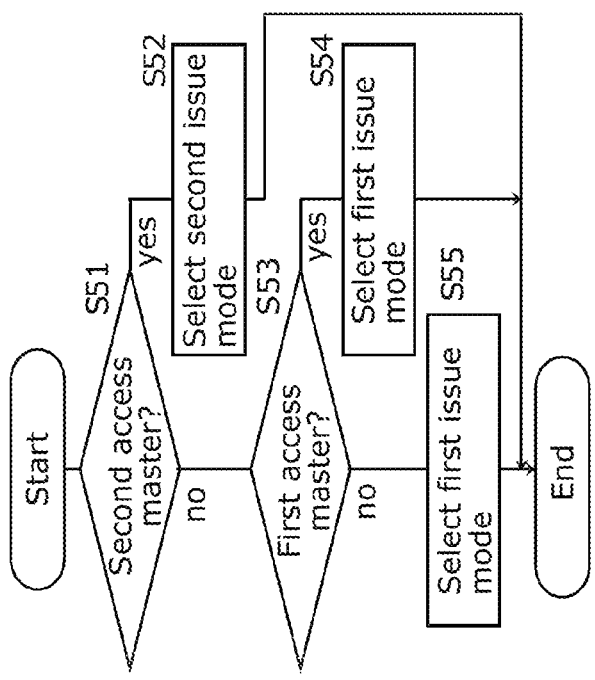
FIG. 5 is a flowchart illustrating another example of operations of the selector in the embodiment.

FIG. 5 is a flowchart illustrating another example of operations of the selector in the embodiment. When determiner 22 determined that the bank is different, selector 23 determines whether or not the access master which sent the memory access request is a second access master among the plurality of access masters 3 (S51). When selector 23 determines that the access master which sent the memory access request is the second access master ("yes" in S51), selector 23 selects the second issue mode (S52).

Further, selector 23 determines whether or not the access master which sent the memory access request is a first access master (S53). When selector 23 determines that the access master which sent the memory access request is the first access master ("yes" in S53), selector 23 selects the first issue mode (S54).

In addition, when the access master which sent the memory access request is neither the first access master nor the second access master ("no" in S53), selector 23 selects the first issue mode (S55).

According to this, since access masters and issue modes are associated with each other, an optimal issue mode can be selected individually for each access master.

Note that, in step S55, selector 23 may select the second issue mode.

Further, although in FIG. 2 and FIG. 3, a case is described in which a memory access request requests a memory read operation, similar operations are also performed in a case where a memory access request requests a memory write operation.

As described above, with memory controller 2 in the embodiment, it is possible to optimize access efficiency by enabling a selection between the first issue mode which does not divide an activation command and the second issue mode which divides an activation command.

As has been described above, memory controller 2 according to the present disclosure is a memory controller that controls access to SDRAM 1 including banks, and includes: receiver 21 that receives a memory access request from access master 3; selector 23 that selects one of a first issue mode and a second issue mode each related to command issuing; and issuer 24 that issues a command sequence to SDRAM 1 in response to the memory access request, in accordance with the one of the first issue mode and the second issue mode which is selected by selector 23, wherein the first issue mode is a mode in which an activation command for activating a bank is issued in continuous clock cycles without dividing the activation command, and the second issue mode is a mode in which an activation command for activating a bank is divided and issued in non-continuous clock cycles.

According to this, further improvement can be achieved. For example, it is possible to optimize the access efficiency and the latency by enabling a selection between the first issue mode which does not divide an activation command and the second issue mode which divides an activation command. For example, optimization is possible by enabling a selection between the first issue mode and the second issue mode according to a usage which processes memory data.

For example, memory controller 2 may include determiner 22 that, when a memory access request is received, determines whether or not issuer 24 has a prior unissued command that corresponds to a prior memory access request received prior to the memory access request and has not yet been issued, and when it is determined that issuer 24 has such a prior unissued command, determines whether or not a bank corresponding to the received memory access request is different from a bank corresponding to the prior unissued command that is a read command (prior unissued read command) or a write command (prior unissued write command). When determiner 23 determines that the bank corresponding to the received memory access request is different from the bank corresponding to the prior unissued read command or write command, selector 23 selects one of the first issue mode and the second issue mode.

According to this, optimization can be achieved by selecting between the respective merits and demerits of the first issue mode and the second issue mode.

In the first issue mode, although a bubble is generated in continuous access of a prior access request and the bus efficiency deteriorates, the latency for read data or write data with respect to a different bank of a subsequent access request can be made the minimum latency.

On the other hand, in the second issue mode, although continuous access of a prior access request can be guaranteed and the bus efficiency is not deteriorated, a delay of one cycle occurs with respect to the minimum latency for read data or write data of a subsequent access request.

In other words, in the first issue mode, minimization of the latency of a subsequent access request is given priority. In the second issue mode, continuous access of a prior access request is guaranteed to thereby give priority to the efficiency of the data bus.

For example, in a case where determiner 22 determines that a prior unissued command is not present, selector 23 may select the first issue mode.

According to this, in a case where a command of a prior access request and a command of a subsequent access request do not compete, the first issue mode is selected for the subsequent access request, and hence continuous access of the prior access request is guaranteed and, furthermore, the latency of the subsequent access request can be minimized.

For example, in a case where an access master which sent a received memory access request is a first access master among a plurality of access masters, selector 23 may select the first issue mode, and in a case where the access master which sent the received memory access request is a second access master among the plurality of access masters, selector 23 may select the second issue mode.

According to this, since access masters and issue modes are associated with each other, an optimal issue mode can be selected individually for each access master.

For example, receiver 21 may receive a mode designation command designating one of the first issue mode and the second issue mode, and selector 23 may select one of the first issue mode and the second issue mode in accordance with the mode designation command.

According to this, an optimal issue mode can be selected by means of a mode designation command.

For example, a memory may be included to hold flag information designating one of the first issue mode and the second issue mode, and selector 23 may read the flag information from the memory, and select one of the first issue mode and the second issue mode in accordance with the flag information read.

According to this, an optimal issue mode can be rapidly selected by means of flag information.

For example, receiver 21 may receive a mode designation command designating one of the first issue mode and the second issue mode, generate the flag information in accordance with the mode designation command, and store the flag information into the memory.

According to this, flag information can be set by means of a mode designation command, and a more optimal issue mode can be selected.

For example, receiver 21 may receive the mode designation command from an access master or another device.

According to this, since there are a plurality of devices which are capable of issuing a mode designation command, the flexibility of the system can be enhanced.

For example, the flag information may be stored in the memory for each of a plurality of access masters, and selector 23 may read the flag information corresponding to the access master that is the access master which sent the received memory access request, and select one of the first issue mode and the second issue mode in accordance with the flag information read.

According to this, since flag information and access masters are associated with each other, an optimal issue mode can be selected individually for each access master.

As has been described above, a memory access control method according to the present disclosure is a memory access control method that controls access to SDRAM 1 including banks, and includes: receiving a memory access request from access master 3; selecting one of a first issue mode and a second issue mode each related to command issuing; and issuing a command sequence to the SDRAM in response to the memory access request in accordance with the selected issue mode, wherein: the first issue mode is a mode in which an activation command for activating a bank is issued in continuous clock cycles without dividing the activation command, and the second issue mode is a mode in which an activation command for activating a bank is divided and issued in non-continuous clock cycles.

According to this, further improvement can be achieved. For example, it is possible to optimize the access efficiency and the latency by enabling a selection between the first issue mode which does not divide an activation command and the second issue mode which divides an activation command. For example, optimization is possible by enabling a selection between the first issue mode and the second issue mode according to a usage that processes memory data.

For example, when a memory access request is received, whether or not a prior unissued command corresponding to a prior memory access request is present may be determined, and when the prior unissued command is determined to be present, whether or not a bank corresponding to the received memory access request is different from a bank corresponding to the prior unissued command may be determined, wherein, when the bank corresponding to the received memory access request is determined to be different from the bank corresponding to the prior unissued command, one of the first issue mode and the second issue mode may be selected in the selecting of the issue mode.

According to this, optimization can be achieved by selecting between the respective merits and demerits of the first issue mode and the second issue mode.

In the first issue mode, although a bubble is generated in continuous access of a prior access request and the bus efficiency deteriorates, the latency for read data or write data with respect to a different bank of a subsequent access request can be made the minimum latency.

On the other hand, in the second issue mode, although continuous access of a prior access request can be guaranteed and the bus efficiency is not deteriorated, a delay of one cycle occurs with respect to the minimum latency for read data or write data of a subsequent access request.

In other words, in the first issue mode, minimization of the latency of a subsequent access request is given priority. In the second issue mode, continuous access of a prior access request is guaranteed to thereby give priority to the efficiency of the data bus.

For example, when the prior unissued command is not determined to be present, the first issue mode may be selected in the selecting.

According to this, in a case where a command of a prior access request and a command of a subsequent access request do not compete, the first issue mode is selected for the subsequent access request, and hence continuous access of the prior access request is guaranteed and, furthermore, the latency of the subsequent access request can be minimized.

For example, in the selecting of the issue mode, the first issue mode may be selected when the access master which sent the received memory access request is a first access master among a plurality of access masters, and the second issue mode may be selected when the access master which sent the received memory access request is a second access master among the plurality of access masters.

According to this, since access masters and issue modes are associated with each other, an optimal issue mode can be selected individually for each access master.

For example, in addition, a mode designation command designating one of the first issue mode and the second issue mode may be received, and in the selecting of the issue mode, one of the first issue mode and the second issue mode may be selected in accordance with the mode designation command.

According to this, an optimal issue mode can be selected by means of a mode designation command.

For example, in the selecting of the issue mode, flag information may be read from a memory holding flag information designating one of the first issue mode and the second issue mode, and one of the first issue mode and the second issue mode may be selected in accordance with the flag information read.

According to this, an optimal issue mode can be rapidly selected by means of flag information.

For example, a mode designation command designating one of the first issue mode and the second issue mode may be received, and flag information may be generated in accordance with the mode designation command and the flag information may be stored into the memory.

According to this, flag information can be set by means of a mode designation command, and a more optimal issue mode can be selected.

For example, a mode designation command may be received from an access master or another device.

According to this, since there are a plurality of devices which are capable of issuing a mode designation command, the flexibility of the system can be enhanced.

For example, flag information may be stored in the memory for each of a plurality of access masters, and in the selecting of the issue mode, flag information corresponding to the access master that is the access master which sent the received memory access request may be read, and one of the first issue mode and the second issue mode may be selected in accordance with the flag information read.

According to this, since flag information and access masters are associated with each other, an optimal issue mode can be selected individually for each access master.

Although memory controller 2 and the method access control method according to aspects of the present disclosure have been described based on embodiments, the present disclosure is not limited to the embodiments. Those skilled in the art will readily appreciate that embodiments arrived at by making various modifications to the above embodiments or embodiments arrived at by selectively combining elements disclosed in the above embodiments without materially departing from the scope of the present disclosure may be included within one or more aspects of the present disclosure.

Each of the elements in each of the above embodiments may be configured in the form of an exclusive hardware product, or may be realized by executing a software program suitable for the element. Each of the elements may be realized by means of a program executing unit, such as a Central Processing Unit (CPU) or a processor, reading and executing the software program recorded on a recording medium such as a hard disk or semiconductor memory.

The invention claimed is:

1. A memory controller that controls access to a Synchronous Dynamic Random Access Memory (SDRAM) including banks, the memory controller comprising:
    a receiver that receives a memory access request from an access master;
    a selector that selects one of a first issue mode and a second issue mode each related to command issuing;
    an issuer that issues a command sequence to the SDRAM in response to the memory access request, in accordance with the one of the first issue mode and the second issue mode which is selected by the selector; and
    a determiner that
    (i) determines, when the receiver receives the memory access request, whether or not the issuer has a prior unissued command corresponding to a prior memory access request received prior to the memory access request, the prior unissued command not having been issued from the issuer, and
    (ii) determines, when the determiner determines that the issuer has the prior unissued command, whether or not a bank corresponding to the memory access request among the banks is different from a bank corresponding to the prior unissued command among the banks, the prior unissued command being a read command or a write command,
    wherein
    the first issue mode is a mode in which an activation command for activating a bank among the banks is issued in continuous clock cycles without dividing the activation command, the activation command being included in the command sequence,
    the second issue mode is a mode in which the activation command is divided and issued in non-continuous clock cycles, and
    when the determiner determines that the bank corresponding to the memory access request is different from the bank corresponding to the prior unissued command, the selector performs the selecting.

2. The memory controller according to claim 1, wherein when the determiner determines that the issuer does not have the prior unissued command, the selector selects the first issue mode.

3. The memory controller according to claim 1, wherein the selector selects the first issue mode when the access master from which the receiver has received the memory access request is a first access master among a plurality of access masters, and
    the selector selects the second issue mode when the access master is a second access master among the plurality of access masters.

4. The memory controller according to claim 1, wherein the receiver receives a mode designation command designating one of the first issue mode and the second issue mode, and
    the selector performs the selecting in accordance with the mode designation command.

5. The memory controller according to claim 1, further comprising:
    a memory holding flag information designating one of the first issue mode and the second issue mode, wherein
    the selector reads the flag information from the memory, and performs the selecting in accordance with the flag information read.

6. The memory controller according to claim 5, wherein the receiver receives a mode designation command designating one of the first issue mode and the second issue mode, generates the flag information in accordance with the mode designation command, and stores the flag information into the memory.

7. The memory controller according to claim 4, wherein the receiver receives the mode designation command from the access master or another device.

8. The memory controller according to claim 5, wherein the flag information is stored in the memory for each of a plurality of access masters including the access master, and
    the selector reads the flag information corresponding to the access master from which the receiver has received the memory access request, and performs the selecting in accordance with the flag information read.

9. A memory access control method of controlling access to a Synchronous Dynamic Random Access Memory (SDRAM) including banks, the memory access control method comprising:
    receiving a memory access request from an access master;
    selecting one of a first issue mode and a second issue mode each related to command issuing;
    issuing a command sequence to the SDRAM in response to the memory access request in accordance with the one of the first issue mode and the second issue mode which is selected in the selecting;
    determining, when the memory access request is received in the receiving, whether or not a prior unissued command corresponding to a prior memory access request received prior to the memory access request is present, the prior unissued command not having been issued; and determining, when the prior unissued command is determined to be present, whether or not a bank corresponding to the memory access request among the banks is different from a bank corresponding to the prior unissued command among the banks, wherein the first issue mode is a mode in which an activation command for activating a bank among the banks is issued in continuous clock cycles without dividing the activation command, the activation command being included in the command sequence, the second issue mode is a mode in which the activation command is divided and issued in non-continuous clock cycles, and the selecting is performed when the bank corresponding to the memory access request is determined to be different from the bank corresponding to the prior unissued command.

10. The memory access control method according to claim 9, wherein in the selecting, the first issue mode is selected when the prior unissued command is not determined to be present.

11. The memory access control method according to claim 9, wherein in the selecting, the first issue mode is selected when the access master from which the memory access request has been received in the receiving is a first access master among a plurality of access masters, and the second issue mode is selected when the access master is a second access master among the plurality of access masters.

12. The memory access control method according to claim 9, further comprising:

receiving a mode designation command designating one of the first issue mode and the second issue mode, wherein the selecting is performed in accordance with the mode designation command.

13. The memory access control method according to claim 9, wherein the selecting includes:

reading, from a memory, flag information designating one of the first issue mode and the second issue mode; and selecting one of the first issue mode and the second issue mode in accordance with the flag information read in the reading.

14. The memory access control method according to claim 13, further comprising:

receiving a mode designation command designating one of the first issue mode and the second issue mode;

generating the flag information in accordance with the mode designation command; and storing the flag information into the memory.

15. The memory access control method according to claim 12, further comprising:

receiving the mode designation command from the access master or another device.

16. The memory access control method according to claim 13, wherein the flag information is stored in the memory for each of a plurality of access masters including the access master, and the selecting includes:

reading the flag information corresponding to the access master from which the memory access request has been received; and selecting one of the first issue mode and the second issue mode in accordance with the flag information read in the reading.

* * * * *

UNITED STATES PATENT AND TRADEMARK OFFICE
CERTIFICATE OF CORRECTION

PATENT NO. : 12,001,691 B2  
APPLICATION NO. : 17/702624  
DATED : June 4, 2024  
INVENTOR(S) : Kazuhito Tanaka Page 1 of 1

It is certified that error appears in the above-identified patent and that said Letters Patent is hereby corrected as shown below:

On the Title Page

Item (73) Assignee should read:
--(73) Assignee
Panasonic Automotive Systems Co., Ltd., Kanagawa (JP)--

Signed and Sealed this
Fifteenth Day of April, 2025

Coke Morgan Stewart
*Acting Director of the United States Patent and Trademark Office*